United States Patent
Shen

(10) Patent No.: US 10,347,509 B1
(45) Date of Patent: Jul. 9, 2019

(54) MOLDED CAVITY FANOUT PACKAGE WITHOUT USING A CARRIER AND METHOD OF MANUFACTURING THE SAME

(71) Applicant: DiDrew Technology (BVI) Limited, Santa Clara, CA (US)

(72) Inventor: Minghao Shen, Santa Clara, CA (US)

(73) Assignee: DIDREW TECHNOLOGY (BVI) LIMITED, Santa Clara, CA (US)

(*) Notice: Subject to any disclaimer, the term of this patent is extended or adjusted under 35 U.S.C. 154(b) by 0 days.

(21) Appl. No.: 15/940,878

(22) Filed: Mar. 29, 2018

Related U.S. Application Data

(60) Provisional application No. 62/628,500, filed on Feb. 9, 2018.

(51) Int. Cl.
| | |
|---|---|
| *H01L 21/56* | (2006.01) |
| *H01L 23/00* | (2006.01) |
| *H01L 23/29* | (2006.01) |
| *H01L 23/522* | (2006.01) |
| *H01L 21/768* | (2006.01) |

(52) U.S. Cl.
CPC ...... *H01L 21/565* (2013.01); *H01L 21/76838* (2013.01); *H01L 23/293* (2013.01); *H01L 23/522* (2013.01); *H01L 24/03* (2013.01); *H01L 2224/0231* (2013.01)

(58) Field of Classification Search
CPC combination set(s) only.
See application file for complete search history.

(56) References Cited

U.S. PATENT DOCUMENTS

| | | | |
|---|---|---|---|
| 5,379,942 | A | 1/1995 | Kuhnert |
| 5,436,745 | A | 7/1995 | Voisin |
| 5,705,855 | A | 1/1998 | Carson |
| 5,822,030 | A | 10/1998 | Uchiyama |
| 6,373,545 | B1 | 4/2002 | Yang |
| 6,456,353 | B1 | 9/2002 | Chen |
| 6,534,338 | B1 | 3/2003 | Schoonejongen |
| 6,627,996 | B1 | 9/2003 | Yokoyama |

(Continued)

OTHER PUBLICATIONS

Chip-On-Glass (COG) for LCD Modules, NXP.
(Continued)

*Primary Examiner* — Ratisha Mehta
(74) *Attorney, Agent, or Firm* — LeClairRyan

(57) ABSTRACT

Disclosed is a method of manufacturing a semiconductor device that includes molding and curing a framing member having an upper side that defines an array of indentations. Semiconductor dies are then adhered to the framing member within respective indentations. The upper side of the framing member and the dies are covered with an RDL. Formation of the RDL includes deposition of a dielectric material that also fills gaps between the dies and the framing member within the indentations. The framing member can be molded to have a thickness that can provide mechanical strength to resist damage to the dies during the formation of the RDL or other manufacturing processes, for example due to warping of the dies. After the RDL is completed, this excess framing member material can then be removed from lower side of the framing member and the structure can be diced to separate the dies into respective semiconductor devices.

14 Claims, 4 Drawing Sheets

(56) References Cited

U.S. PATENT DOCUMENTS

| | | |
|---|---|---|
| 6,885,032 B2 | 4/2005 | Forbes |
| 7,002,809 B2 | 2/2006 | Lee |
| 7,839,469 B2 | 11/2010 | Wu |
| 8,044,464 B2 | 10/2011 | Yamazaki |
| 8,048,358 B2 | 11/2011 | Takano |
| 8,513,124 B1 | 8/2013 | Ponnuswamy |
| 9,202,716 B2 | 12/2015 | Park et al. |
| 9,381,732 B2 | 7/2016 | Lindner et al. |
| 9,449,935 B1 | 9/2016 | Shih et al. |
| 9,502,323 B2 | 11/2016 | Lin et al. |
| 9,547,208 B2 | 1/2017 | Grip |
| 9,664,932 B2 | 5/2017 | Nishino |
| 9,679,785 B2 | 6/2017 | Chinnusamy |
| 9,766,518 B2 | 9/2017 | Fujikawa |
| 9,911,672 B1 | 3/2018 | Wu et al. |
| 2002/0142566 A1 | 10/2002 | Ravi |
| 2003/0137621 A1 | 7/2003 | Zhang |
| 2005/0029644 A1 | 2/2005 | Ho |
| 2006/0290011 A1 | 12/2006 | Cobbley |
| 2007/0117354 A1 | 5/2007 | Gadkaree |
| 2008/0111786 A1 | 5/2008 | Goudarzi |
| 2008/0142946 A1 | 6/2008 | Yang |
| 2008/0182363 A1 | 7/2008 | Amrine |
| 2008/0268618 A1 | 10/2008 | Yamazaki |
| 2009/0001504 A1 | 1/2009 | Takei |
| 2010/0072618 A1 | 3/2010 | Camacho |
| 2010/0203676 A1 | 8/2010 | Theuss |
| 2011/0127654 A1 | 6/2011 | Weng |
| 2011/0221041 A1 | 9/2011 | Lin |
| 2011/0316156 A1 | 12/2011 | Pagaila |
| 2012/0000613 A1 | 1/2012 | Thallner |
| 2012/0217643 A1 | 8/2012 | Pagaila |
| 2013/0134445 A1* | 5/2013 | Tarsa ............... B29C 45/4457 257/88 |
| 2013/0147063 A1* | 6/2013 | Park .................. H01L 21/568 257/777 |
| 2013/0277675 A1 | 10/2013 | Yoshikawa |
| 2014/0061893 A1 | 3/2014 | Saeidi |
| 2014/0175637 A1 | 6/2014 | Stuber et al. |
| 2014/0335658 A1* | 11/2014 | Scanlan ............... H01L 21/78 438/113 |
| 2015/0055036 A1 | 2/2015 | Weber et al. |
| 2015/0325520 A1 | 11/2015 | Yu |
| 2016/0054612 A1 | 2/2016 | Hao |
| 2016/0099242 A1 | 4/2016 | Mallikarjunaswamy |
| 2016/0111035 A1 | 4/2016 | Morita |
| 2016/0203787 A1 | 7/2016 | Park |
| 2016/0238862 A1 | 8/2016 | Nishino |
| 2016/0276307 A1 | 9/2016 | Lin |
| 2016/0372426 A1 | 12/2016 | Luan |
| 2017/0018450 A1 | 1/2017 | Tang |
| 2017/0103904 A1 | 4/2017 | Nguyen |
| 2017/0200647 A1 | 7/2017 | Stering |
| 2018/0040489 A1 | 2/2018 | Fehkuhrer |
| 2018/0076142 A1 | 3/2018 | Shim et al. |
| 2018/0145059 A1* | 5/2018 | Welch ................ H01L 25/0753 |

OTHER PUBLICATIONS

Matope, S. et al. "Silver, Copper and Aluminium Coatings for Micro-Material Handling Operations", South African Journal of Industrial Engineering, Aug. 2013, vol. 24(2), pp. 69-77.

Solder from Wikipedia.

* cited by examiner

MOLDED CAVITY FANOUT PACKAGE WITHOUT USING A CARRIER AND METHOD OF MANUFACTURING THE SAME

RELATED APPLICATION

The present application claims priority to U.S. Provisional Application No. 62/628,500 filed Feb. 9, 2018, entitled "Molded Cavity Fanout" which is incorporated herein by reference in its entirety.

FIELD OF THE INVENTION

The present disclosure relates to semiconductor packaging technologies.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation.

The terms "die", "semiconductor chip", and "semiconductor die" are used interchangeably throughout this specification. The term wafer is used herein include any structure having an exposed surface onto which a layer is deposited according to the present invention, for example, to form the circuit structure.

FIGS. 1A through 1E show schematic, cross-sectional diagrams of a typical method for fabricating a semiconductor package having a redistribution layer (RDL).

Referring to FIG. 1A, multiple semiconductor dies 100 are placed onto an adhesive layer 102, which in turn is applied to a carrier substrate 104. Each die 100 includes a substrate made of a semiconductor material, such as gallium arsenide (GaAs), gallium nitride (GaN), or silicon (Si) with an integrated circuit formed thereon (or therein). Next, as illustrated in FIG. 1B, an encapsulation material 106 is deposited (or formed) over the semiconductor die 100 and on the exposed portions of the adhesive layer 102. Depending on the material used as the encapsulation material 106, a curing process is then performed to at least partially cure the encapsulation material 106.

After the encapsulation material 106 is cured, the encapsulation material 106 becomes partially rigid and forms an encapsulated structure. The encapsulated material 106 has an initial thickness that is greater than desired. Thus, an exposed surface of the encapsulation material 106 undergoes a grinding (and/or polishing and/or abrasion) process to expose the die 100 as shown in FIG. 1C. In some instance, the surface of the encapsulation material 106 may be subjected to a chemical mechanical polishing process. Referring to FIG. 1D, an RDL layer 108 is formed over the die 100, including various insulating layers and conductive traces in electrical communication with the die 100. Also, contact formations (e.g., solder balls) 110 can be formed in electrical communication with the RDL layer 108. Referring to FIG. 1E, the carrier substrate 104 and adhesive layer 102 are then de-bonded from the structure. From here, the structure can be cut or diced into individual semiconductor devices having respective ones of the die 100.

Packaging processes such as the one described above have several drawbacks. The encapsulation process typically includes the use of the carrier substrate 104 because strong mechanical support is desired to prevent warping. The addition and removal of the carrier substrate 104 add additional steps to the process that increase time and expense of manufacturing. Also, additional encapsulant is used to fill the gaps between die 100. This also adds to manufacturing expense and increases manufacturing time because of the step of grinding away excess encapsulant. Thus, there exists a desire in the industry for improved packaging processes that can reduce cost and manufacturing time compared to such prior processes.

BRIEF SUMMARY

A method of manufacturing a semiconductor device, according to some embodiments of the present disclosure, includes providing first and second molding plates configured to form a molded structure having a plurality of indentations. Next, a molding compound is dispensed between the first and second molding plates, and then the first and second molding plates are brought together so as to mold the molding compound between the first and second molding plates. The molding compound is then solidified, thereby forming a framing member comprising a plurality of framing structures that define a plurality of indentations in the framing member. Next, each of a plurality of dies is adhered to the framing member within respective indentations of the framing member such that each of the plurality of dies is at least partially surrounded by at least one of the plurality of framing structures. In some such embodiments, each die has a respective active surface and at least one respective integrated circuit region. Next, a redistribution layer (RDL) is formed on the dies and framing structures of the framing member, thereby resulting in a multi-die panel. In some such embodiments, the forming of the RDL can include forming dielectric structures in the plurality of indentations between each of the dies and respective adjacent framing structures. Next, the multi-layer panel is cut or diced along the plurality of framing structures to obtain separate semiconductor devices.

In some embodiments, the molding compound can comprise an epoxy resin. In some such embodiments, the solidifying of the molding compound can include curing the epoxy resin.

In some embodiments, the method can further comprise providing a release film between the first and second molding plates such that the release film is between the molding compound and at least one of the first and second molding plates prior to the bringing of the first and second molding plates together.

In some embodiments, the plurality of indentations of the framing member are arranged on a first side of the framing member, and wherein the method further comprises removing material of the framing member from a second side of the framing member, the second side being opposite the first side of the framing member.

In some embodiments, each of the plurality of dies can comprise silicon.

In some embodiments, the RDL layer includes conductive structures that are electrically connected to respective dies.

A method of manufacturing a semiconductor device, according to some embodiments of the present disclosure, includes providing a plurality of molding plates configured to form a molded structure having a first and second indentations. Next, a molding compound is shaped using the plurality of molding plates, and then the molding compound is solidified, thereby forming a framing member comprising a plurality of framing structures that define the first and second indentations in the framing member. Next, first and second dies are adhered to the framing member within the first and second indentations, respectively, of the framing member such that each of the first and second dies is at least partially surrounded by at least one of the plurality of framing structures. In some embodiments, each of the first and second dies has a respective active surface and at least one respective integrated circuit region. Next, a redistribution layer (RDL) is formed on the first and second dies and framing structures of the framing member, thereby resulting in a multi-die panel. In some embodiments, the forming of the RDL can include forming dielectric structures in the first and second indentations between each of the first and second dies and respective adjacent framing structures. Next, the multi-layer panel is cut or diced along the plurality of framing structures to obtain separate semiconductor devices.

In some embodiments, the molding compound comprises an epoxy resin. In some such embodiments, the solidifying of the molding compound can include curing the epoxy resin.

In some embodiments, the method can further comprise providing a release film adjacent to at least one of the plurality of molding plates such that the release film is between the molding compound and the at least one of the plurality of molding plates prior to the shaping of the molding compound.

In some embodiments, the first and second indentations of the framing member are arranged on a first side of the framing member. In some such embodiments, the method can further comprise removing material of the framing member from a second side of the framing member, the second side being opposite the first side of the framing member.

In some embodiments, each of the first and second dies comprises silicon.

In some embodiments, the RDL layer includes conductive structures that are electrically connected to at least of the first and second dies.

A semiconductor device, according to some embodiments of the present disclosure, comprises a die having an active surface and at least one integrated circuit region. The device also comprises a framing structure adjacent to the die and a dielectric structure at least partially interposing the die and the framing structure. The device further comprises a redistribution layer (RDL) on the die, on the framing structure, and on the dielectric structure. In some such embodiments, the RDL is electrically connected to the die.

In some embodiments, the framing structure can comprise a molding compound. In some such embodiments, the molding compound can comprise an epoxy resin.

In some embodiments, the die comprises silicon.

In some embodiments, the RDL comprises at least a dielectric layer and metal features in the dielectric layer. In some such embodiments, at least one of the metal features is electrically connected to the die.

DETAILED DESCRIPTION

Figure 1A:
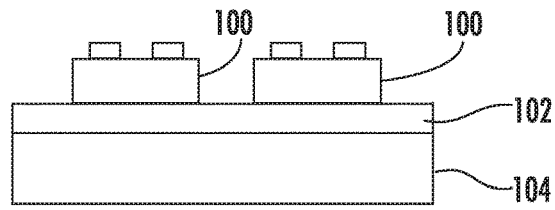
FIGS. 1A-1E show schematic, cross-sectional diagrams of a typical method for fabricating a semiconductor package having a redistribution layer (RDL).
Figure 1B:
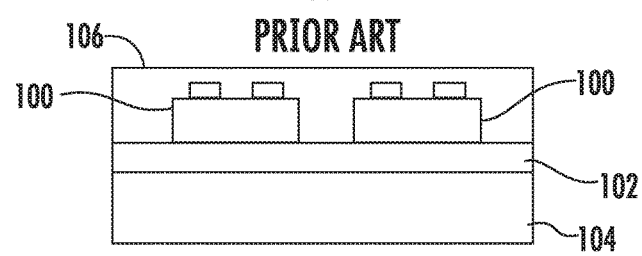
Figure 1C:
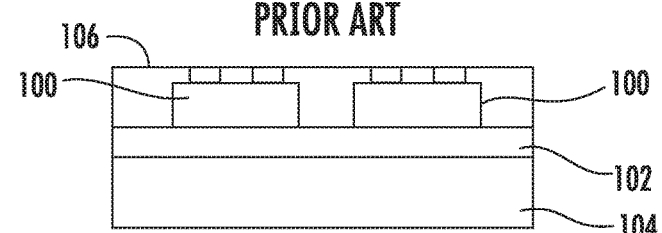
Figure 1D:
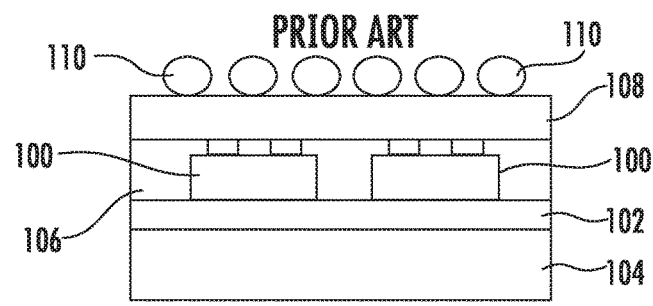
Figure 1E:
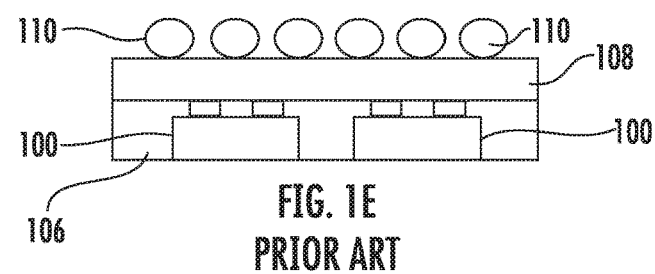

This disclosure relates to a wafer level packaging process. For example, in semiconductor wafer packaging processes, the wafer can be a semiconductor wafer or device wafer which has thousands of chips on it. Thin wafers, especially ultra-thin wafers (thickness less than 60 microns or even 30 microns) are very unstable, and more susceptible to stress than traditional thick wafers. During processing, thin wafers may be easily broken and warped. Therefore, temporary bonding to a rigid support carrier substrate can reduce the risk of damage to the wafer. However, the use of the support carrier involves attaching the carrier substrate and later removing the carrier substrate. These additional steps allow for the desired increased rigidity at the cost of extra time and expense involved in the manufacturing process. Therefore, the methods disclosed herein allow for a wafer level packaging process that does not require the use of a carrier substrate. Instead, a framing member is molded to have one or more cavities for supporting respective dies. The dies, with the support of the framing member, can then be processed with desired semiconductor packaging operations including RDL formation and dicing into individual chips.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

FIGS. 2A-2D show schematic, cross-sectional diagrams showing an exemplary method for fabricating a wafer level package according to the present disclosure.

Figure 2A:
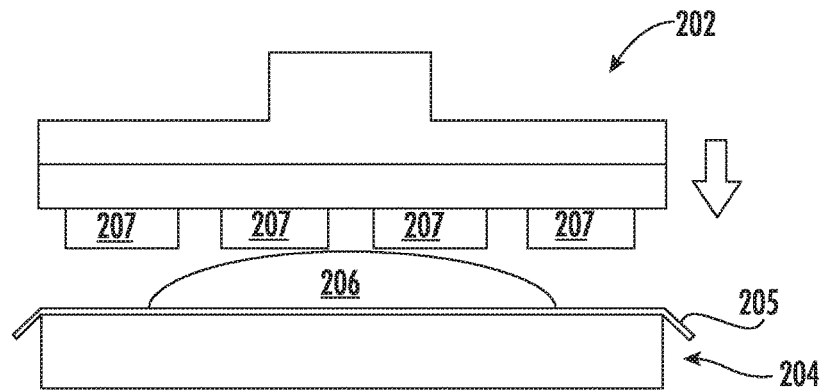
FIGS. 2A-2D show schematic, cross-sectional diagrams of an exemplary method for fabricating a wafer level package according to embodiments of the present disclosure.
Figure 2B:
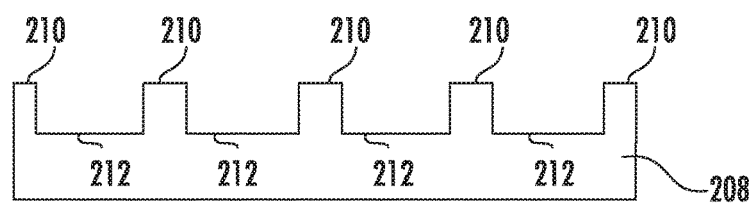

More specifically, FIG. 2A shows a molding apparatus for molding a framing member according to an embodiment of the present disclosure (a formed framing member 208 is best shown in FIG. 2B). The molding apparatus includes a first molding plate 202, a second molding plate 204, and a release film 205, and molds framing structures and indentations of a framing member all at once and individually. While two molding plates are shown and described in connection with the illustrated embodiment, it will be appreciated that alternative embodiments can include more than two plates that can be configured to work together to form a framing member 208 according to the present disclosure.

The first molding plate 202 can be made of metal, for example, and multiple protrusions 207 are formed in the first molding plate 202 and extend from the pressing surface of the first molding plate 202. The protrusions 207 correspond in number and position to semiconductor dies 214 (shown in FIG. 2C, for example) to be supported by the framing member. The protrusions 207 are formed as rectangularly shaped pressing members supported by the first molding plate 202. In alternative embodiments that include more than two molding plates, the protrusions 207 can be all provided on a single molding plate or the protrusions 207 can be distributed amongst more than one molding plate. The protrusions 207 are shaped to allow for the formation of respective rectangular or square shaped indentations (as observed in the plan view, for example in FIG. 3) in a molding compound 206 (for example, such as indentations 212 defined by framing structures 210 shown in cross-sectional view in FIG. 2B and in plan view in FIG. 3). Alternatively, instead of or in addition to forming rectangular or square depressions, any desired shape can be selected for the depressions formed in the molding compound 206. The dimensions of the protrusions 207 can be selected as desired, preferably based at least in part on the dimensions of dies to be placed therein. The second molding plate 204 includes a pressing body that can be formed of metal, for example.

An optional release film 205 may be provided on a contact surface of the second molding plate 204 between the first molding plate 202 and the second molding plate 204 such that the release film 205 is between the molding compound 206 and at least one of the first molding plate 202 and the second molding plate 204 prior to the molding compound 206 being supplied to the molding apparatus. In some embodiments, the first molding plate 202 and/or the second molding plate 204 can be configured to heat the molding compound 206 in order to cure or harden the molding compound 206 as part of the process of forming the framing member 208. In such embodiments, the release film 205 may remain in place between the first and second molding plates 202, 204 during the curing process. Release film 205 can have elasticity and heat resistance, and it may be desirable for it to have the property of softening at a lower temperature than the temperature at which the molding apparatus is heated. For example, in some embodiments, the first and/or second molding plates 202, 204 can be heated to about 150° C., so the softening temperature of the release film 205 is preferably selected to be at or above 150° C. For example, the release film 205 can comprise a thermoplastic fluorine resin (e.g., ETFE) plastic film.

In some embodiments, the molding compound 206 can be any of several known epoxy molding compounds for semiconductors, preferably of known types that are suitable for compression molding. Compression molding of the molding compound 206 can be accomplished by placing the molding compound 206 into a mold cavity defined by the first and second molding plates 202, 204. In some embodiments, the molding compound 206 and/or the first and/or second molding plates 202, 204 can be preheated prior to placement of the molding compound 206 in the molding apparatus shown in FIG. 2A. The mold cavity defined by the first and second molding plates 202, 204 is closed by bringing the first and second molding plates 202, 204 closer together, for example with a top force as indicated by the arrow in FIG. 2A. The first and second molding plates 202, 204 apply pressure to force the molding compound 206 into a shape based on the shapes of the surfaces of the first and second molding plates 202, 204 that are adjacent to the molding compound 206 during the compression operation.

The molding process using the molding apparatus shown in FIG. 2A can employ thermosetting resins in a partially cured stage, either in the form of granules, putty-like masses, or preforms. Prior to curing, an epoxy includes a resin and a curing agent. When polymerization occurs, the material becomes an organized crystalline type structure in what is sometimes referred to as a "glassy state." In this state, the molecules can vibrate but are otherwise locked in place. As the temperature rises, the molecules can move more freely and the material gradually starts to soften. As the temperature continues to rise, the polymer eventually experiences a profound state change to a more pliable, rubbery state. Although this state transition takes place gradually over a range of temperatures, the glass transition temperature range (Tg) is often designated by a specific temperature. The actual glass transition temperature range depends upon several factors, including the molecular structure of the material, sample preparation, the cure schedule, and the degree of cure. However, as an example, epoxy molding compounds are known that can be used as the molding compound 206 that have a specified glass transition temperature (Tg) in the range of 120° C. and 170° C. In such embodiments, the first and/or second molding plates 202, 204 can be heated to at least the specified Tg of the molding compound 206 in order to at least partially cure the molding compound 206. The first and/or second molding plates 202, 204 can thus apply heat and pressure to the molding compound 206, and the heat and pressure are preferably maintained until the molding compound 206 has cured. However, in some embodiments, only a portion of curing process for curing the molding compound 206 may be performed at this point, and the curing process can be completed at a later time, such as after material removal operations described below in connection with FIG. 2D.

Figure 3:
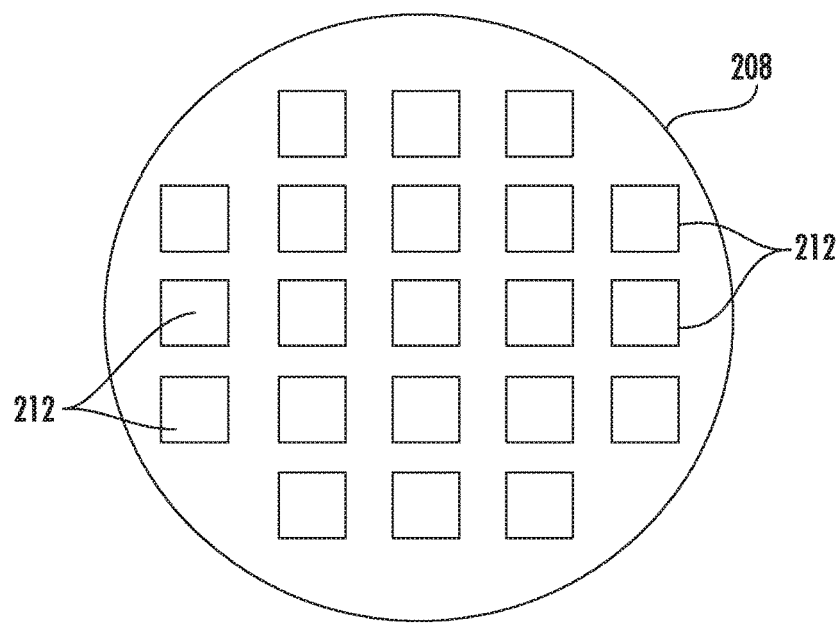
FIG. 3 shows a plan view of an embodiment of a framing member according to an embodiment of the present disclosure.

FIG. 2B is a cross sectional view of an embodiment of a framing member 208 that can be formed using the molding apparatus shown in FIG. 2A. Also, FIG. 3 shows a plan view of an embodiment of a framing member 208 that can be formed using the molding apparatus shown in FIG. 2A. The framing member 208 can therefore be formed of a cured molding compound 206, such as an epoxy molding compound. The framing member 208 comprises a plurality of framing structures 210 that define a plurality of indentations 212 in the framing member 208. The framing member 208 serves, at least in part, to eliminate the use of a carrier substrate, such as the carrier substrate 104 shown in FIG. 1A-1D, which was used in prior processes.

Figure 2C:
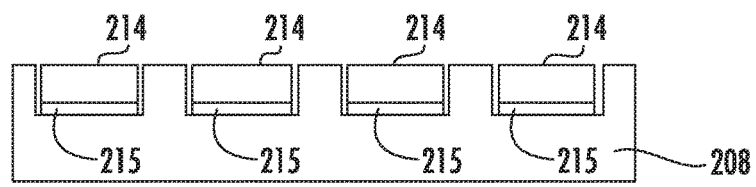

Turning next to FIG. 2C, a plurality of semiconductor dies 214 are disposed in indentations 212 of the framing member 208. For example, the semiconductor dies 214 can be such that each of the dies 214 has a respective active surface and at least one respective integrated circuit region. In some embodiments, dies 214 are adhered to the framing member 208 within respective indentations 212 of the framing member 208. Preferably, as shown in FIG. 2C, each of the plurality of dies 214 is placed in a respective indentation 212 and is at least partially surrounded by framing structures 210.

In some embodiments, the dies 214 can be placed in the indentations 212 using a pick and place (PnP) procedure. The PnP procedure is preferable performed by a known PnP device (not shown). For example, a typical PnP device includes a bond head used to grab a die 214 that is to be placed in one of the indentations 212. The bond head then translates the die 214 to an indentation 212 and attach the die 214 therein. This process is called the pick and place movement. Careful die handling is desirable in order to maintain overall quality and good yields from the manufacturing process. Due to the delicate nature of dies 214, (particularly on the active side of the die 214), using a PnP machine allows for minimal contact and relative force to pick up, move, and place die 214. In some embodiments, however, a degree of manual removal can be employed in conjunction with, or instead of, an automated process by using a PnP machine. However, the possibility mechanical damage to the die 214 is often reduced by using PnP automation. Also, the use of a PnP device can allow for decreased manufacturing times as known PnP devices are available that enable fast output turn-arounds that are difficult otherwise. Also, the use of an automatic PnP device can reduce placement errors, such as errors related to die orientation. In some embodiments, human-performed tasks can be included in the PnP device operations. For example, some PnP devices allow an operator to manually adjust the X and Y coordinates to center on a die 214 to be picked up by viewing it on a magnified screen. The die 214 can be collect picked up by the PnP device in a number of ways according to a variety of known PnP devices and operational methods. For example, in some PnP devices, a die 214 can be picked up by the PnP device using a vacuum powered mechanical arm that sweeps into position, picks up the die 214, and then places the die into a desired one of the indentations 212. Appropriate bonding time and force for the attachment of a die 214 into an indentation 212 is preferable in order to allow for a strong bond between the die 214 and the framing member 208.

The dies 214 can be attached and held in place in the indentations 212 using and adhesive, which forms adhesive layer 215. The adhesive layer 215 may be adhesive tape, or alternatively, may be a glue or epoxy applied to the indentations 212 via a spin-on process, or the like. In some embodiments, the adhesive layer 215 can comprise, for example, die attach film (DAF), which is commercially available. In some embodiments, the adhesive layer 215 can comprise, for example, epoxy paste adhesives that are commercially available for die attachment.

Figure 2D:
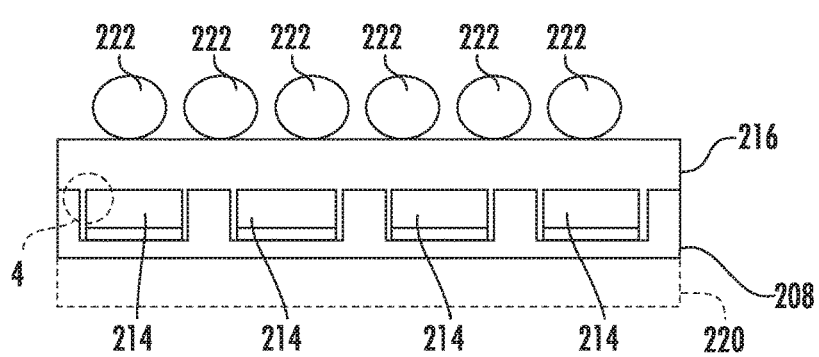
Figure 4:
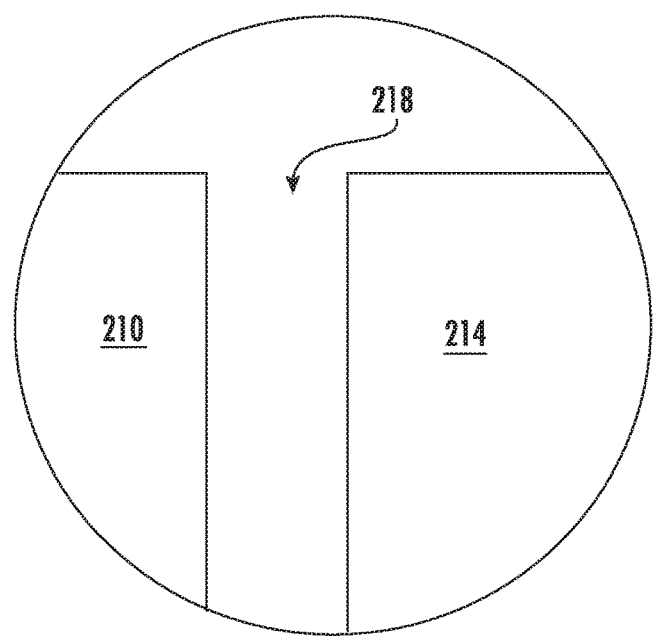
FIG. 4 shows an enlarged view of portion 4 of FIG. 2D.

Turning next to FIG. 2D, a redistribution layer (RDL) 216 is formed on the dies 214 and on the framing member 208. The formation of the RDL 216 includes coating or laminating the dies 214 and framing member 208 with a dielectric material to planarize the upper surface. Referring now also to FIG. 4, which shows an enlarged view of the indicated portion of FIG. 2D, the dielectric material also forms dielectric structures 218 by filling in gaps between the dies 214 and their neighboring framing structures 210. In some embodiments, the dielectric material may not be able to fill in the gaps between the dies 214 and their neighboring framing structures 210 depending on how the dielectric material is processed or due to the size of the dielectric material.

The remainder of the RDL 216 can be formed according to known methods, generally involving formation of layers of metal and dielectric material. The metal structures of the RDL 216 are electrically connected to contact points on the dies 214. Also, to provide electrical connection between the RDL 216 and other circuitry, a plurality of bumps 222 such as micro-bumps or copper pillars are formed. Optionally, a thermal process may be performed to reflow the bumps 222.

Once the processes described above have been completed, a material removal process can be used to remove excess material from the framing member 208. When the framing member 208 is formed, the thickness is selected to provide enough mechanical strength to mitigate wafer warpage and thereby allow for semiconductor devices to be effectively produced from the dies 214. However, once the manufacturing process is close enough to completion for warpage concerns to be reduced, the excess thickness of the framing member 208 on the back side of the dies 214 can be reduced. The material removal process can include, for example, grinding to remove excess framing portion 220 from the back of the dies 214.

As will be appreciated, further processing can include a dicing or sawing process along kerf regions to separate individual dies 214 and their respective wafer level packages from one another. It is understood that the sectional structures depicted in the figures are for illustration purposes only.

Figure 5:
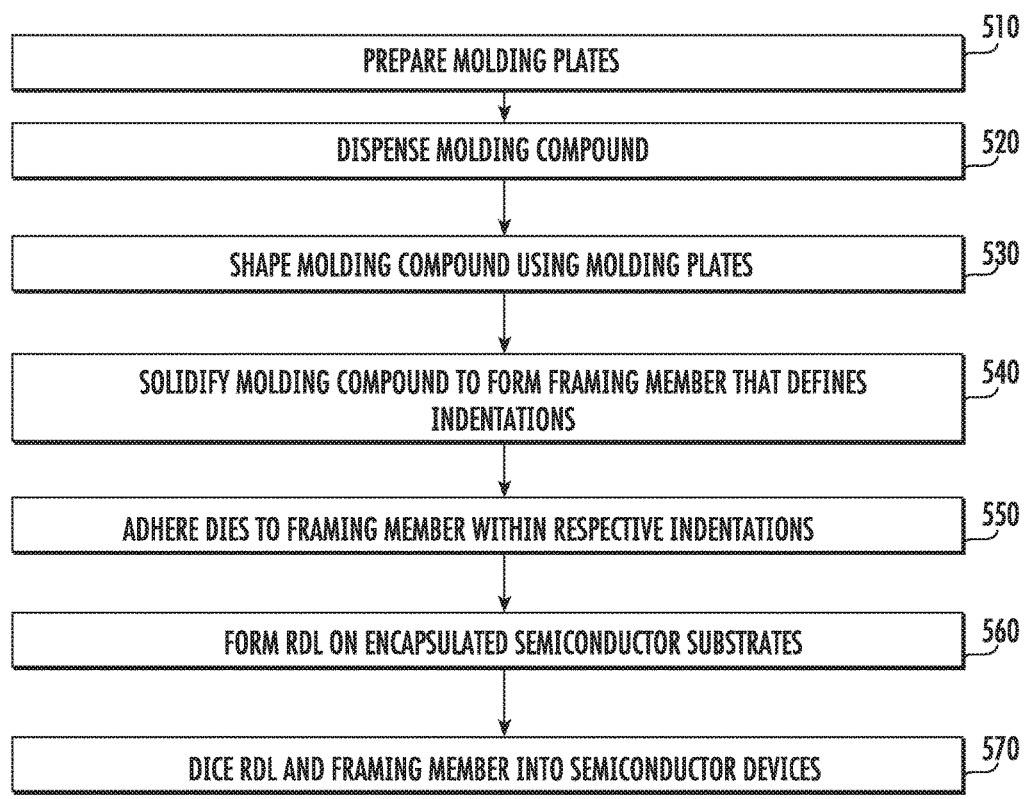
FIG. 5 is a process flow diagram showing an exemplary method for fabricating a wafer level package according to the present disclosure.

FIG. 5 is a process flow diagram showing an exemplary method for fabricating a wafer level package according to the present disclosure. In this embodiment, the method of manufacturing a semiconductor device starts with a step 510 of providing first and second molding plates configured to form a molded structure having a plurality of indentations. In some embodiments, additional molding plates can be used in concert with the first and second molding plates to form a molded structure having a plurality of indentations. In some embodiments, the next step 520 includes dispensing a molding compound between the first and second molding plates. In some such embodiments, a release film can be provided between the first and second molding plates. In some embodiments, the next step 530 can include bringing the molding plates together so as to mold the molding compound in a molding cavity defined by the molding plates. In some such embodiments, a release film can be placed between the molding compound and at least one of the molding plates prior to bringing the molding plates together.

In some embodiments, the next step 540 can include solidifying the molding compound, thereby forming a framing member comprising a plurality of framing structures that define the plurality of indentations in the framing member. In some such embodiments, the molding compound can comprise an epoxy resin. In some such embodiments, the solidifying of the molding compound can include curing the epoxy resin, for example using heat and/or pressure.

In some embodiments, the next step 550 can include adhering a plurality of dies to the framing member within respective indentations of the framing member such that each of the plurality of dies is at least partially surrounded by at least one of the plurality of framing structures. In some embodiments, each of the dies can include a respective active surface and at least one respective integrated circuit region. In some embodiments, each of the dies can also comprise silicon. In some embodiments, the next step 560 can include forming a redistribution layer (RDL) on the dies and framing structures of the framing member, thereby resulting in a multi-die panel. In some such embodiments, the RDL layer can include conductive structures that are electrically connected to respective dies. In some such embodiments, the forming of the RDL can include forming dielectric structures in the indentations between the dies and their respective adjacent framing structures. In some embodiments, the step 560 can include removing excess material of the framing member from the back side of the dies once the mechanical support provided by the excess framing material is no longer needed. In some embodiments, the next step 570 can include dicing the multi-layer panel along framing structures to obtain separate semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing first and second molding plates configured to form a molded structure having a plurality of indentations;
   dispensing a molding compound between the first and second molding plates;
   bringing the first and second molding plates together so as to mold the molding compound between the first and second molding plates, wherein a corresponding plurality of protrusions on one of the first and second molding plates physically causes the plurality of indentations to form in the molding compound during this bringing step;
   solidifying the molding compound, thereby forming a framing member comprising a plurality of framing structures that define the plurality of indentations in the framing member;
   adhering a plurality of dies to the framing member within respective indentations of the framing member such that each of the plurality of dies is at least partially surrounded by at least one of the plurality of framing structures, wherein each die has a respective active surface and at least one respective integrated circuit region;
   forming a redistribution layer (RDL) on the dies and framing structures of the framing member, thereby resulting in a multi-die panel, wherein the forming of the RDL includes forming dielectric structures in the plurality of indentations between each of the dies and respective adjacent framing structures; and
   dicing the multi-layer panel along the plurality of framing structures to obtain separate semiconductor devices.

2. The method of claim 1, wherein the molding compound comprises an epoxy resin.

3. The method of claim 2, wherein the solidifying of the molding compound includes curing the epoxy resin.

4. The method of claim 1, further comprising providing a release film between the first and second molding plates such that the release film is between the molding compound and at least one of the first and second molding plates prior to the bringing of the first and second molding plates together.

5. The method of claim 1, wherein the plurality of indentations of the framing member are arranged on a first side of the framing member, and wherein the method further comprises removing material of the framing member from a second side of the framing member, the second side being opposite the first side of the framing member.

6. The method of claim 1, wherein each of the plurality of dies comprises silicon.

7. The method of claim 1, wherein the RDL layer includes conductive structures that are electrically connected to respective dies.

8. A method of manufacturing a semiconductor device, comprising:
   providing a plurality of molding plates configured to form a molded structure having first and second indentations;
   shaping a molding compound using the plurality of molding plates, wherein corresponding first and second protrusions on one of the plurality of molding plates physically causes the first and second indentations to form in the molding compound during this shaping step;
   solidifying the molding compound, thereby forming a framing member comprising a plurality of framing structures that define the first and second indentations in the framing member;
   adhering first and second dies to the framing member within the first and second indentations, respectively, of the framing member such that each of the first and second dies is at least partially surrounded by at least one of the plurality of framing structures, wherein each of the first and second dies has a respective active surface and at least one respective integrated circuit region;
   forming a redistribution layer (RDL) on the first and second dies and framing structures of the framing member, thereby resulting in a multi-die panel, wherein the forming of the RDL includes forming dielectric structures in the first and second indentations between each of the first and second dies and respective adjacent framing structures; and
   dicing the multi-layer panel along the plurality of framing structures to obtain separate semiconductor devices.

9. The method of claim 8, wherein the molding compound comprises an epoxy resin.

10. The method of claim 9, wherein the solidifying of the molding compound includes curing the epoxy resin.

11. The method of claim 8, further comprising providing a release film adjacent to at least one of the plurality of molding plates such that the release film is between the molding compound and the at least one of the plurality of molding plates prior to the shaping of the molding compound.

12. The method of claim 8, wherein the first and second indentations of the framing member are arranged on a first side of the framing member, and wherein the method further comprises removing material of the framing member from a second side of the framing member, the second side being opposite the first side of the framing member.

13. The method of claim 8, wherein each of the first and second dies comprises silicon.

14. The method of claim 8, wherein the RDL layer includes conductive structures that are electrically connected to at least of the first and second dies.

* * * * *